United States Patent
Song

(10) Patent No.: US 7,978,551 B2
(45) Date of Patent: Jul. 12, 2011

(54) BIT LINE EQUALIZING CONTROL CIRCUIT OF A SEMICONDUCTOR MEMORY APPARATUS

(75) Inventor: Woo-Seok Song, Ichon (KR)

(73) Assignee: Hynix Semiconductor Inc. (KR)

( * ) Notice: Subject to any disclaimer, the term of this patent is extended or adjusted under 35 U.S.C. 154(b) by 372 days.

(21) Appl. No.: 12/345,777

(22) Filed: Dec. 30, 2008

(65) Prior Publication Data

US 2009/0303822 A1    Dec. 10, 2009

(30) Foreign Application Priority Data

Jun. 4, 2008    (KR) .................. 10-2008-0052696

(51) Int. Cl.
*G11C 7/00* (2006.01)
(52) U.S. Cl. .............. 365/203; 365/202; 365/230.03
(58) Field of Classification Search .............. 365/203, 365/202, 230.03
See application file for complete search history.

(56) References Cited

U.S. PATENT DOCUMENTS

| 5,487,044 | A | | 1/1996 | Kawaguchi et al. |
| 5,946,251 | A | * | 8/1999 | Sato et al. .................. 365/203 |
| 6,222,782 | B1 | | 4/2001 | Chon |

FOREIGN PATENT DOCUMENTS

| KR | 1020010055884 A | 7/2001 |
| KR | 1020080003050 A | 7/2008 |

* cited by examiner

*Primary Examiner* — Son Dinh
*Assistant Examiner* — Nam T Nguyen
(74) *Attorney, Agent, or Firm* — Baker & McKenzie LLP

(57) ABSTRACT

A bit line equalizing control circuit of a semiconductor memory apparatus includes a control signal generating unit that receives a bank active signal to generate a control signal such that a bit line equalizing signal is delayed and enabled, a bit line equalizing selecting unit that generates a bit line equalizing detection signal in response to a plurality of mat select signals and the control signal, and a driver that receives the bit line equalizing detection signal to generate the bit line equalizing signal.

15 Claims, 6 Drawing Sheets

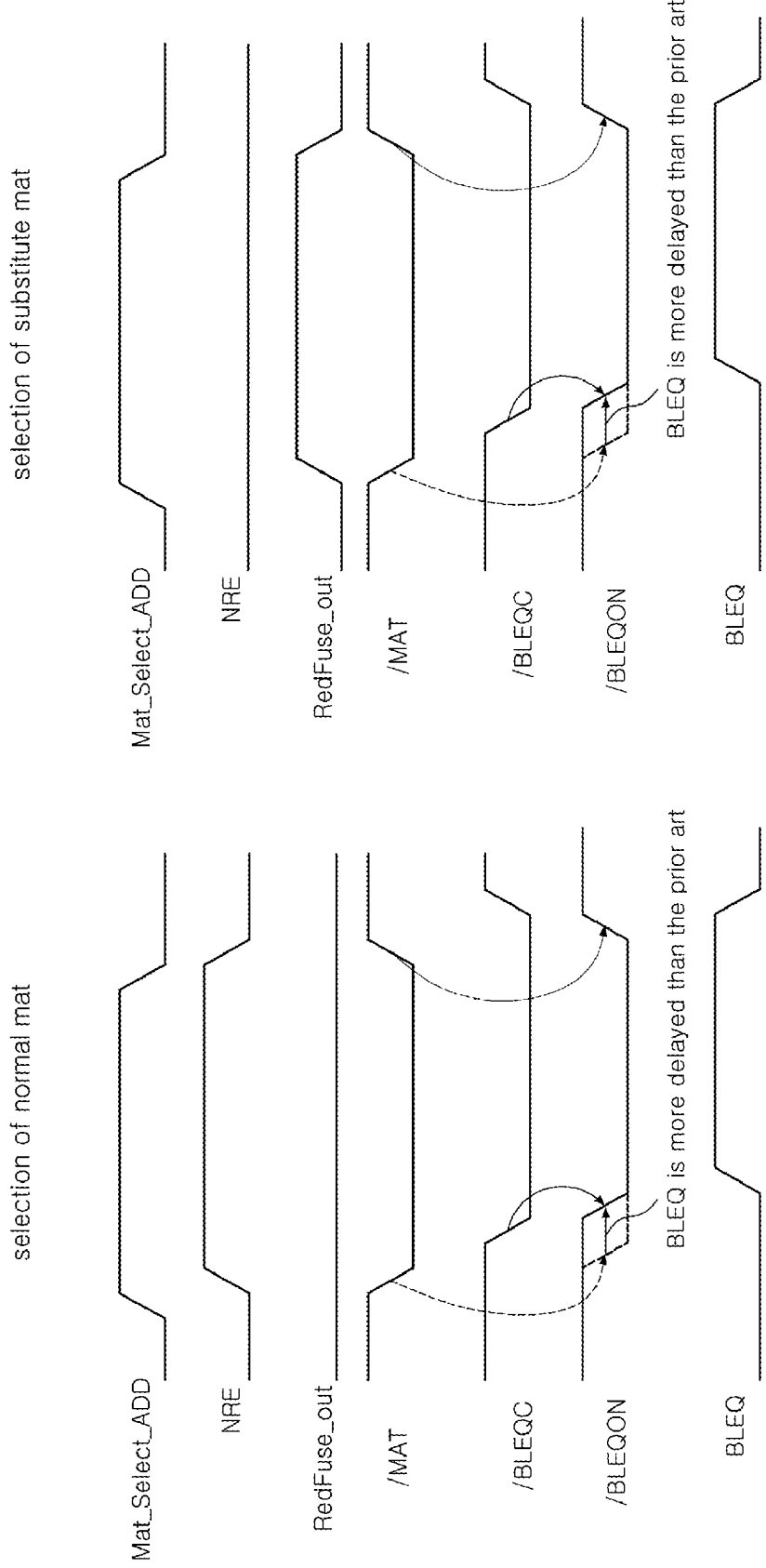

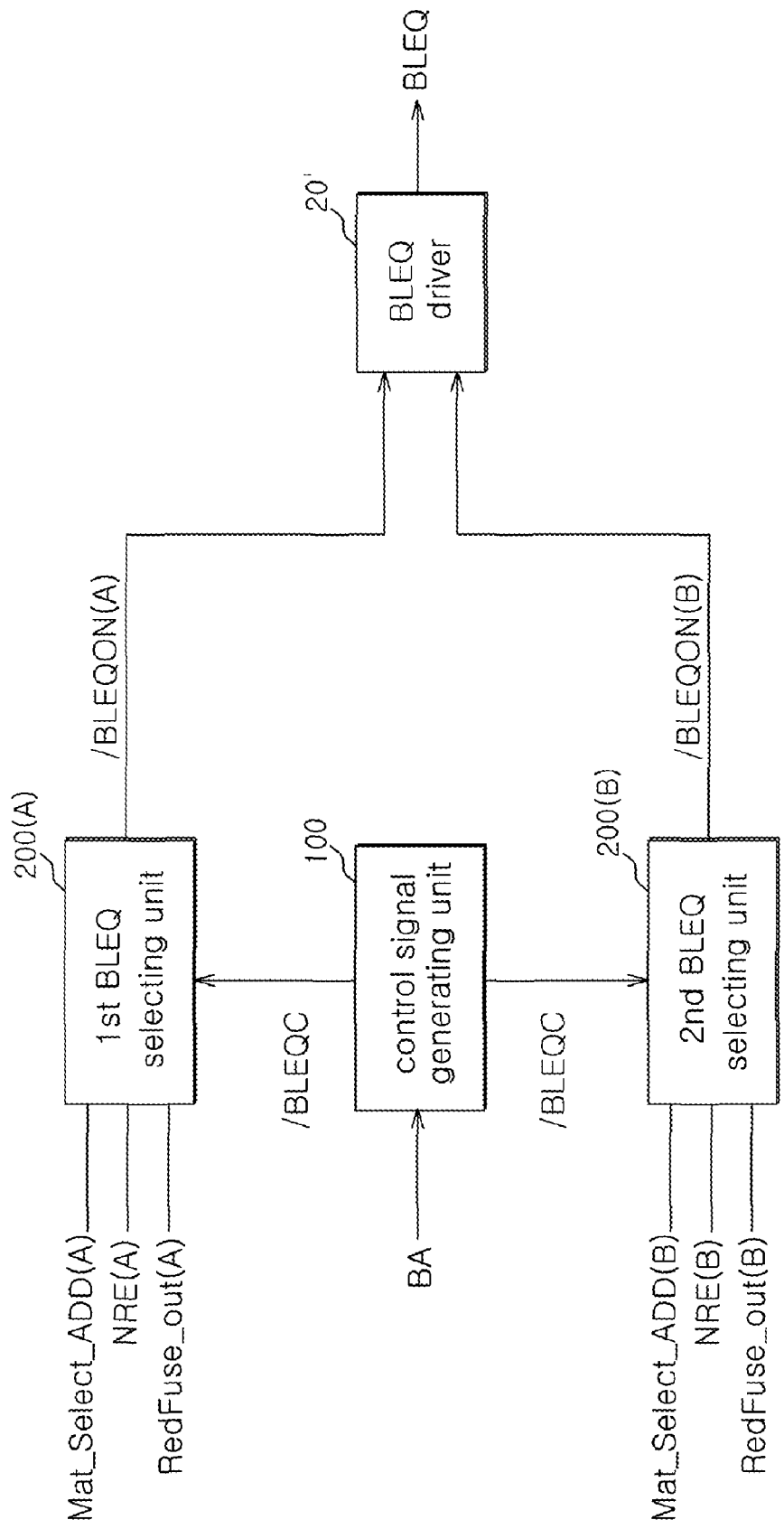

BIT LINE EQUALIZING CONTROL CIRCUIT OF A SEMICONDUCTOR MEMORY APPARATUS

CROSS-REFERENCES TO RELATED APPLICATION

The present application claims priority under 35 U.S.C. §119(a) to Korean application number 10-2008-0052696, filed on Jun. 4, 2008, in the Korean Intellectual Property Office, which is incorporated herein by reference in its entirety as if set forth in full.

BACKGROUND

1. Technical Field

The embodiments described herein relate to a bit line control circuit of a semiconductor memory apparatus and, more particularly, to a bit line equalizing control circuit of a semiconductor memory apparatus.

2. Related Art

Generally, a semiconductor memory apparatus periodically performs an active operation and a precharge operation. When an active command is input to the semiconductor memory apparatus, a word line is activated, and charge sharing occurs between a bit line and a complement bit line. Accordingly, a bit line sense amplifier is driven so that the voltage of the bit line or the complement bit line is raised to a core voltage level. If a precharge command is input, then the voltage of the bit line and the complement bit line is equalized to a precharge voltage level (one-half of the core voltage level). A time period until a next active command is input to the semiconductor memory apparatus after the precharge command is input is commonly referred to as a row address strobe (RAS) precharge time (tRP). In order to manufacture high-speed memory apparatuses, reduction of the RAS precharge time, which is one of many asynchronous parameters of the memory apparatuses, is important.

FIG. 1 is a schematic block diagram of a conventional bit line equalizing circuit. In FIG. 1, a bit line equalizing circuit 101 includes a first bit line equalization (BLEQ) selecting unit 10(A), a second bit line equalization selecting unit 10(B), and a bit line equalizing driver 20. The first BLEQ selecting unit 10(A) receives a first mat select address signal 'Mat_Select_ADD(A)', a first normal row enable signal 'NRE(A)', and a first redundancy fuse output signal 'RedFuse_out(A)', and produces an output signal '/BLEQON(A)'. The second BLEQ selecting unit 10(B) receives a second mat select address signal 'Mat_Select_ADD(B)', a second normal row enable signal 'NRE(B)', and a second redundancy fuse output signal 'RedFuse_out(B)', and produces an output signal '/BLEQON(B)'. The bit line equalizing driver 20 receives the output signals '/BLEQON(A)' and '/BLEQON(B)' of the first and second BLEQ selecting units 10(A) and 10(B), respectively, to generate a bit line equalizing signal 'BLEQ'. Although not shown, the bit line equalizing signal 'BLEQ' is input to a bit line sense amplifier. Here, the first and second BLEQ selecting units 10(A) and 10(B) have the same structure.

FIG. 2 is a schematic circuit diagram of a conventional bit line equalizing selecting unit of FIG. 1. In FIG. 2, the BLEQ selecting unit 10 includes a first NAND gate 11, a first inverter 13, a second NAND gate 12, and a second inverter 14. The first NAND gate 11 receives a mat select address signal 'Mat_Select_ADD' and a normal row enable signal 'NRE'. The first inverter 13 inverts a redundancy fuse output signal 'RedFuse_out'. The second NAND gate 12 receives outputs of the first NAND gate 11 and the first inverter 13, and the second inverter 14 inverts an output of the second NAND gate 12.

FIG. 3 is a schematic circuit diagram of a conventional bit line equalizing driver of FIG. 1. In FIG. 3, the bit line equalizing driver 20 includes a NAND gate 21, a first inverter 22, and a second inverter 23. The NAND gate 21 receives an output of the BLEQ selecting unit 10 (of FIG. 1). The first inverter 22 receives an output of the NAND gate 21, and the second inverter 23 receives an output of the first inverter 22.

A conventional operational procedure of the bit line equalizing circuit will be described. If an array control block is selected by a row address input with an active command, and a mat inside a core cell is selected through the array control block, then both the mat select address signal 'Mat_Select_ADD' and the normal row enable signal 'NRE' are enabled at a high level. When a mat of a redundancy circuit is selected in order to replace a defected mat detected in a wafer test, the normal row enable signal 'NRE' is not enabled, but the redundancy fuse output signal 'RedFuse_out' is enabled. When both the normal row enable signal 'NRE' and the redundancy fuse output signal 'RedFuse_out' are enabled, an output signal '/BLEQON' of the BLEQ selecting unit 10 is enabled at a low level. The bit line equalizing driver 20 receives the output signal '/BLEQON' enabled at a low level to generate the bit line equalizing signal 'BLEQ' used to equalize the bit line and the complement bit line.

As shown in FIG. 1, in a semiconductor memory apparatus employing a scheme in which core cells share a sense amplifier, a signal '/BLEQON(A)' or a signal '/BLEQON(B)' is input to the bit line equalizing driver 20 provided in the array control block, and the bit line equalizing signal 'BLEQ' is supplied to the same sense amplifier through the bit line equalizing driver 20. Accordingly, the signal '/BLEQON(A)' is output from the first BLEQ selecting unit 10(A) when a predetermined mat is selected from one adjacent core cell, and the signal '/BLEQON(B)' is output from the second BLEQ selecting unit 10(B) when a predetermined mat is selected from another core cell.

A RAS precharge time (tRP) is determined by subtracting a time (Time B) from a time (Time A). Here, the Time A refers to a time period in which the voltage level of the bit line and the complement bit line of the mat becomes a one-half level (VBLP) of a core voltage after the precharge command is input. Similarly, the Time B refers to a time period in which the level of the bit line and the complement bit line is raised to the level of the core voltage after the active command is input. In order to enhance the tRP, the Time A to equalize the bit line and the complement bit line after the precharge command is input must be set within a short period of time, or the Time B to release equalizing of the bit line and the complement bit line after the active command is input must be delayed.

If the tRP is reduced, a high-speed semiconductor memory apparatus can be manufactured. In order to enhance the tRP, only a scheme to reduce the Time A is commonly used instead of a scheme to delay the Time B.

SUMMARY

A bit line equalizing control circuit of a semiconductor memory apparatus capable of delaying start timing to release equalization of a bit line is described herein.

In one aspect, a bit line equalizing control circuit of a semiconductor memory apparatus includes a control signal generating unit that receives a bank active signal to generate a control signal such that a bit line equalizing signal is delayed and enabled, a bit line equalizing selecting unit that generates a bit line equalizing detection signal in response to a plurality of mat select signals and the control signal, and a driver that receives the bit line equalizing detection signal to generate the bit line equalizing signal.

In another aspect, a bit line equalizing control circuit of a semiconductor memory apparatus includes a control signal generating unit that receives a bank active signal to generate a control signal such that a bit line equalizing signal is delayed and enabled, a first bit line equalizing selecting unit that generates a first bit line equalizing detection signal in response to the control signal and a plurality of first mat select signals when a mat is selected from a first core cell, a second bit line equalizing selecting unit that generates a second bit line equalizing detection signal in response to the control signal and a plurality of second mat select signals when a mat is selected from a second core cell different from the first core cell, and a bit line equalizing driver that receives the first and second bit line equalizing detection signals to generate the bit line equalizing signal.

These and other features, aspects, and embodiments are described below in the section "Detailed Description."

BRIEF DESCRIPTION OF THE DRAWINGS

Features, aspects, and embodiments are described in conjunction with the attached drawings, in which:

FIG. 8 is a timing diagram demonstrating an exemplary operation of a bit line equalizing control circuit according to one embodiment; and FIG. 9 is a schematic block diagram of an exemplary bit line equalizing control circuit of a semiconductor memory apparatus according to one embodiment.

DETAILED DESCRIPTION

Figure 1:
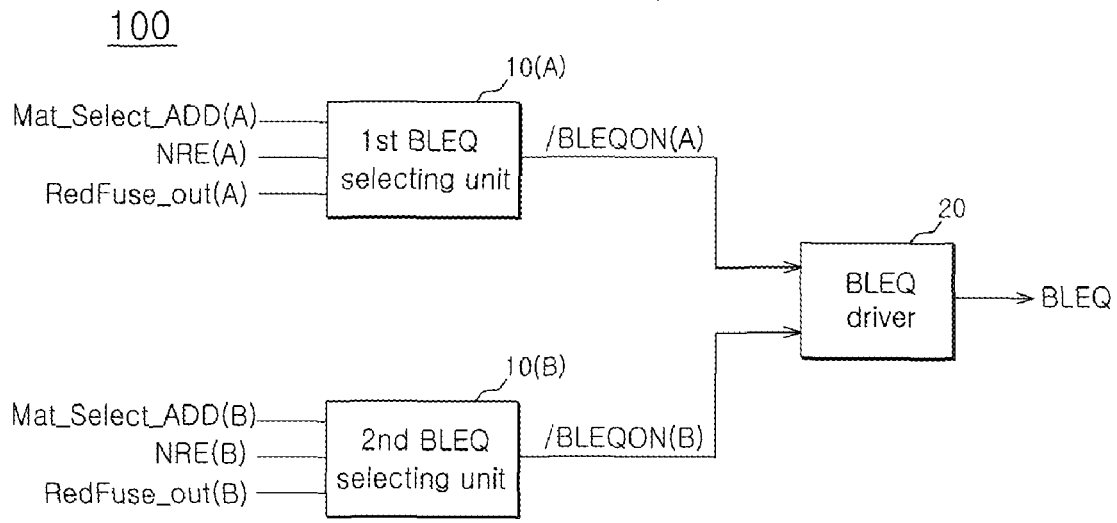
FIG. 1 is a schematic block diagram of a conventional bit line equalizing circuit.
Figure 2:
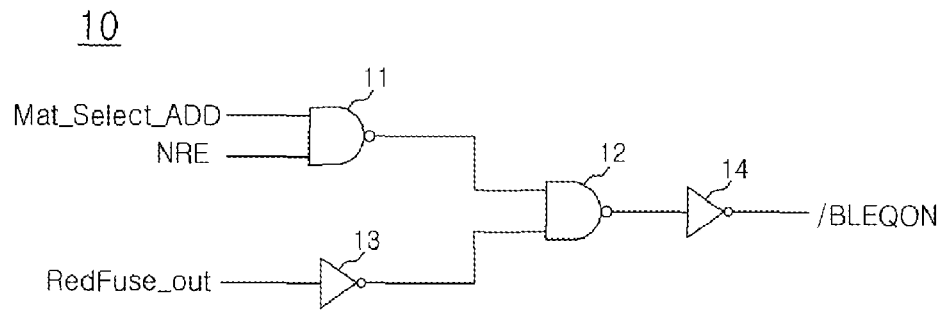
FIG. 2 is a schematic circuit diagram of a conventional bit line equalizing selecting unit that can be included in the circuit of FIG. 1.
Figure 3:
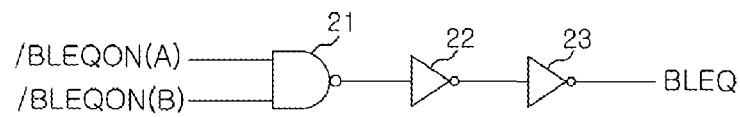
FIG. 3 is a schematic circuit diagram of a conventional bit line equalizing driver that can be included in the circuit of FIG. 1.
Figure 4:
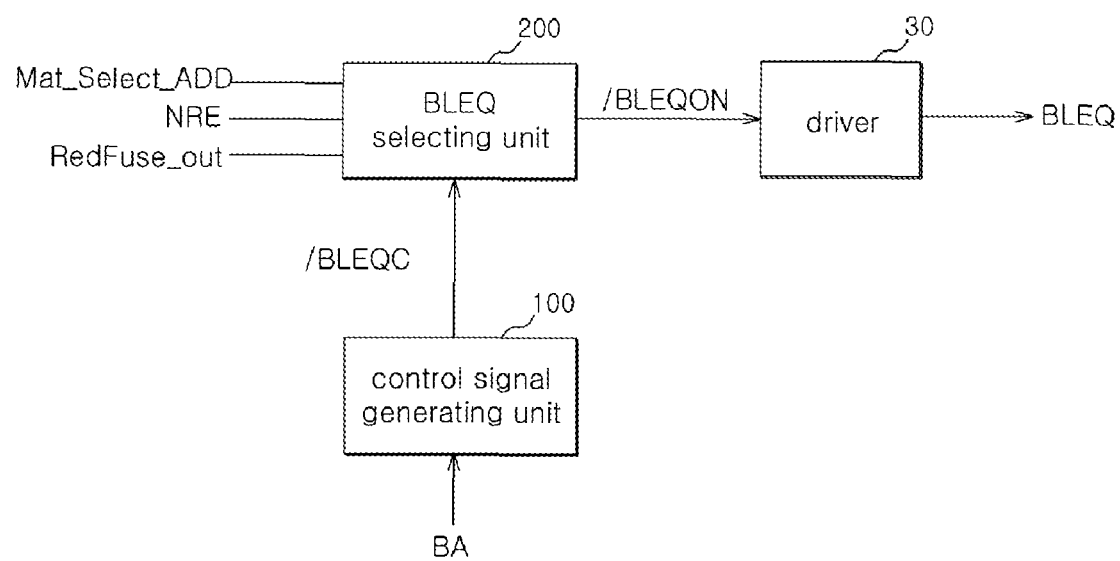
FIG. 4 is a schematic block diagram of an exemplary bit line equalizing control circuit according to one embodiment.

FIG. 4 is a schematic block diagram of an exemplary bit line equalizing control circuit according to one embodiment. In FIG. 4, a bit line equalizing control circuit 1 of a semiconductor memory apparatus can be configured to include a control signal generating unit 100, a bit line equalization (BLEQ) selecting unit 200, and a driver 30.

The control signal generating unit 100 can directly receive and delay a bank active signal 'BA' to generate a control signal '/BLEQC'. The control signal '/BLEQC' can be input to the BLEQ selecting unit 200 such that a bit line equalizing detection signal '/BLEQON' can be delayed and enabled. If the bit line equalizing detection signal '/BLEQON' is delayed and enabled, then a bit line equalizing signal '/BLEQ' may be delayed and enabled.

Figure 7:
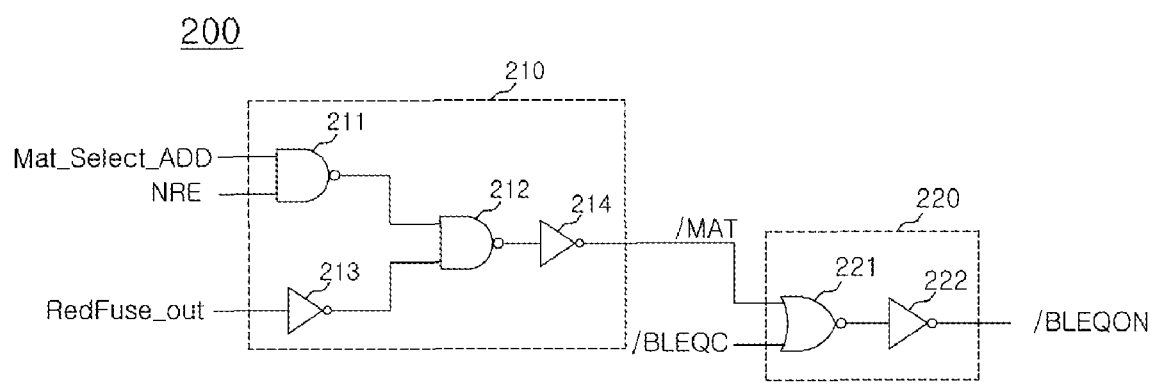
FIG. 7 is a schematic circuit diagram of an exemplary bit line equalizing selecting unit that can be included in the circuit of FIG. 4 according to one embodiment.

FIG. 7 is a schematic circuit diagram of an exemplary bit line equalizing selecting unit of FIG. 4 according to one embodiment. In FIG. 7, the BLEQ selecting unit 200 can be configured to include a signal combining unit 210 and a detection signal generating unit 220. Here, the BLEQ selecting unit 200 can receive a plurality of mat select signals and the control signal '/BLEQC' to generate the bit line equalizing detection signal '/BLEQON'.

The signal combining unit 210 can receive the plurality of mat select signals to generate an output signal '/MAT' enabled at a low level. Here, the plurality of mat select signals can include a mat select address signal 'Mat_Select_ADD', a normal row enable signal 'NRE', and a redundancy fuse output signal 'RedFuse_out'. The mat select address signal 'Mat_Select_ADD' can be used to select a mat from a core cell by a row address input provided with an external active command. The normal row enable signal 'NRE' can include information about the state of a redundancy circuit.

When the mat is selected by the mat select address signal 'Mat_Select_ADD', the normal row enable signal 'NRE' can be enabled during normal operation of the mat without defects. In contrast, when the mat is defective so that a substitute mat of the redundancy circuit is selected, the normal row enable signal 'NRE' can be maintained at a disabled state. The redundancy fuse output signal 'RedFuse_out' can be a signal to notify that a substitute mat for the mat is selected from the redundancy circuit when the mat is defective. For example, when the mat to be selected is normally operated without a defect, the redundancy fuse output signal 'RedFuse_out' can be maintained at a disabled state. In contrast, if the mat to be selected is defected, so that the substitute mat of the redundancy circuit is selected, then the redundancy fuse output signal 'RedFuse_out' can be enabled.

The detection signal generating unit 220 can be configured to perform an OR logic operation with respect to the output signal '/MAT' of the signal combining unit 210 and the control signal '/BLEQC' generated from the control signal generating unit 100 to generate the bit line equalizing detection signal '/BLEQON'. Since the output signal '/MAT' of the signal combining unit 210 and the control signal '/BLEQC' can be enabled at a low level, the detection signal generating unit 220 of the BLEQ selecting unit 200 can generate the bit line equalizing detection signal '/BLEQON', which can be enabled after additional delay.

In FIG. 4, the driver 30 can receive the bit line equalizing detection signal '/BLEQON' and can generate the bit line equalizing signal 'BLEQ' so that the equalizing state of the bit line and the complement bit line can be released.

Figure 5:
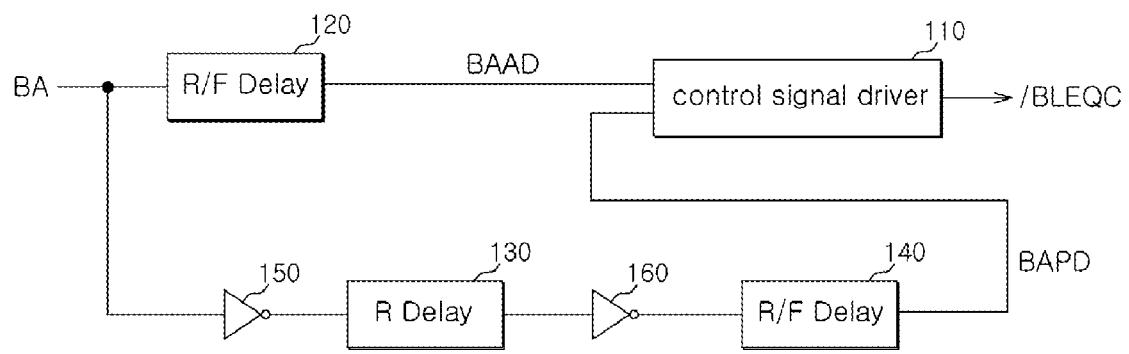
FIG. 5 is a schematic circuit diagram of an exemplary control signal generating unit that can be included in the circuit of FIG. 4 according to one embodiment.

FIG. 5 is a schematic circuit diagram of an exemplary control signal generating unit of FIG. 4 according to one embodiment. In FIG. 5, a control signal generating unit 100 can receive the bank active signal 'BA' and can generate the control signal '/BLEQC' to adjust a time period to release equalizing of the bit line and the complement bit line. Here, the bank active signal 'BA' can be enabled when the active command is input, and can be disabled when the precharge command is input. Accordingly, the control signal generating unit 100 can delay the bank active signal 'BA'.

The control signal generating unit 100 can include a control signal driver 110 that receives the delayed bank active signal 'BA' to output the control signal '/BLEQC'. The control signal generating unit 100 can generate first and second delay signals 'BAAD' and 'BAPD', and can generate the control signal '/BLEQC' through the control signal driver 110 in order to delay and enable the bit line equalizing signal '/BLEQON'.

In FIG. 4, the control signal '/BLEQC' is preferably enabled at a time later than a time to enable the output signal '/MAT' of the signal combining unit 210 constituting the BLEQ selecting unit 200. In addition, the control signal '/BLEQC' can be disabled simultaneously with, or later than, a time to disable the output signal '/MAT' of the signal combining unit 210. The first delay signal 'BAAD' can be used to determine a time to enable the control signal '/BLEQC', and the second delay signal 'BAPD' can be used to determine a time to disable the control signal '/BLEQC'. Accordingly, the control signal generating unit 100 can delay the first and second delay signals 'BAAD' and 'BAPD' to determine times to enable and disable the control signal '/BLEQC'.

In FIG. 5, in order to determine a time to enable the control signal '/BLEQC', the control signal generating unit 100 can delay the bank active signal 'BA' through a rising/falling delay (R/F Delay) 120 to generate the first delay signal 'BAAD'. For example, to determine a time to disable the control signal '/BLEQC', the control signal generating unit 100 can delay the bank active signal 'BA' through a first inverter 150, a rising delay (R Delay) 130, a second inverter 160, and a rising/falling delay (R/F Delay) 140 to generate the second delay signal 'BAPD'. Here, the control signal '/BLEQC' can be enabled at a time later than the time to enable the output signal '/MAT' of the signal combining unit 210, and faster than a time to enable a word line inside a mat, which is selected by the active command.

An exemplary use of the bank active signal 'BA' to generate the control signal '/BLEQC' will be described. A semiconductor memory apparatus can have a plurality of individual mats. These mats can be configured to include the BLEQ selecting unit 200 (of FIGS. 4 and 7) that receives a plurality of mat select signals related to the mats in order to generate the bit line equalizing detection signal '/BLEQON'. Accordingly, one control signal generating unit 100 can receive the bank active signal 'BA' to generate a global control signal, wherein the global control signal may be input to the BLEQ selecting unit 200 belonging to each mat. Thus, the global control signal can be input to the BLEQ selecting unit 200 related to each mat in order to delay start timing to release equalization of the bit line.

Figure 6:
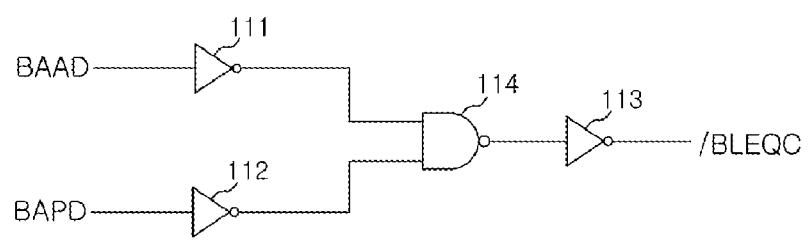
FIG. 6 is a schematic circuit diagram of an exemplary control signal driver that can be included in the control signal generating unit of FIG. 5 according to one embodiment.

FIG. 6 is a schematic circuit diagram of an exemplary control signal driver of FIG. 5 according to one embodiment. In FIG. 6, a control signal driver 110 can be configured to include a first inverter 111, a second inverter 112, a NAND gate 114, and a third inverter 113. The first inverter 111 can invert the first delay signal 'BAAD', and the second inverter 112 can invert the second delay signal 'BAPD'. The NAND gate 114 can receive output of the first and second inverters 111 and 112, and the third inverter 113 can invert an output of the NAND gate 114. The control signal driver 110 can generate the control signal '/BLEQC' to allow the bit line equalizing detection signal '/BLEQON' (of FIG. 4) to be delayed and enabled.

In FIG. 7, the BLEQ selecting unit 200 can include the signal combining unit 210 and the detection signal generating unit 220. The signal combining unit 210 can be configured to include a first NAND gate 211, a first inverter 213, a second NAND gate 212, and a second inverter 214. The first NAND gate 211 can receive the mat select address signal 'Mat_Select_ADD' and the normal row enable signal 'NRE'. The first inverter 213 can invert the redundancy fuse output signal 'RedFuse_out'. The second NAND gate 212 can receive outputs of the first NAND gate 211 and the first inverter 213, and the second inverter 214 can invert an output of the second NAND gate 212. The detection signal generating unit 220 can include a NOR gate 221 and a third inverter 222. The NOR gate 221 can receive the output signal '/MAT' of the second inverter 214 and the control signal '/BLEQC', and the third inverter 222 can invert an output of the NOR gate 221.

The signal combining unit 210 can receive the mat select address signal 'Mat_Select_ADD', the normal row enable signal 'NRE', and the redundancy fuse output signal 'RedFuse_out' to produce the output signal '/MAT' enabled at a low level, if a mat of a core cell, or a substitute mat of the redundancy circuit, is selected. The detection signal generating unit 220 can receive the output signal '/MAT' of the signal combining unit 210, which is enabled at a low level, and the control signal '/BLEQC' generated from the control signal generating unit 100 (of FIGS. 4 and 5) to generate the bit line equalizing detection signal '/BLEQON' that can be enabled after being additionally delayed.

In FIG. 4, the driver 30 can include two inverters to sequentially invert input signals. For example, the driver 30 can receive the bit line equalizing detection signal '/BLEQON', which is an output of the bit line equalizing selector 200, to generate the bit line equalizing signal 'BLEQ'.

FIG. 8 is a timing diagram demonstrating an exemplary operation of a bit line equalizing control circuit according to one embodiment. An exemplary operation of a bit line equalizing control circuit 1 (of FIG. 4) of a semiconductor memory apparatus will be described with reference to the timing chart of FIG. 8.

Initially, the bank active signal 'BA' can be enabled if an active command is input from an external apparatus. The control signal generating unit 100 can directly receive the bank active signal 'BA', and can perform a delay operation. As described above, in order to generate the control signal '/BLEQC' enabled at a time later than a time to enable the output signal '/MAT' of the signal combining unit 210, or disabled simultaneously with or at a time later than a time to disable the output signal '/MAT', the control signal generating unit 100 can delay the bank active signal 'BA' to generate the first and second delay signals 'BAAD' and 'BAPD'. The first and second delay signals 'BAAD' and 'BAPD' can be input to the control signal driver 110 of the control signal generating unit 100 to generate the control signal '/BLEQC'.

Referring to FIGS. 7 and 8, an array control block can be selected by a row address input with an external active command, and the mat select address signal 'Mat_Select_ADD', which selects a mat of a core cell through the array control block, can be input to the signal combining unit 210 of the BLEQ selecting unit 200. The normal row enable signal 'NRE' and the redundancy fuse output signal RedFuse_out can be input to the signal combining unit 210 of the BLEQ selecting unit 200. The mat select address signal 'Mat_Select_ADD' and the normal row enable signal 'NRE' can be input to the first NAND gate 211 of the signal combining unit 210 of the BLEQ selecting unit 200, and the redundancy fuse output signal 'RedFuse_out' can pass through the first inverter 213 of the signal combining unit 210 of the BLEQ selecting unit 200. If a normal mat is selected, then the mat select address Mat select signal 'ADD' can be enabled at a high level, and the normal row enable signal 'NRE' can be enabled at a high level. The redundancy fuse output signal 'RedFuse_out' can be maintained at a disable state.

In contrast, if a mat to be selected has a defect so that a substitute mat of the redundancy circuit is selected, then the normal row enable signal 'NRE' is not enabled, but the redundancy fuse output signal 'RedFuse_out' can be enabled at a high level. If the normal mat of the core cell is selected or the substitute mat of the redundancy circuit is selected, then the output signal '/MAT' having a low level can be input the NOR gate 221 of the detection signal generating unit 220 through the first NAND gate 211, the first inverter 213, the second NAND gate 212, and the second inverter 214 of the signal combining unit 210 of the BLEQ selecting unit 200. If a precharge command is input, then the select signals can be disabled, and the output signal '/MAT' having a high level can be input to the NOR gate 221 of the detection signal generating unit 220 through the second inverter 214 of the signal combining unit 210 of the BLEQ selecting unit 200.

The control signal '/BLEQC' can be input to the NOR gate 221. Then, the bit line equalizing detection signal '/BLEQON' can be generated through an OR logic operation of the detection signal generating unit 220 of the BLEQ selecting unit 200.

The bit line equalizing detection signal '/BLEQON' can be input to the driver 30 to generate the bit line equalizing signal 'BLEQ'. Then, the bit line equalizing signal 'BLEQ' can be input to the bit line sense amplifier to release the equalizing state of the bit line and the complement bit line.

FIG. 9 is a schematic block diagram of an exemplary bit line equalizing control circuit of a semiconductor memory apparatus according to one embodiment. In FIG. 9, plural adjacent core cells can share the bit line sense amplifier.

As shown in FIG. 9, the bit line equalizing control circuit 2 can be configured to include the control signal generating unit 100, a first BLEQ selecting unit 200(A), a second BLEQ selecting unit 200(B), and a bit line equalizing driver 20'. The control signal generating unit 100 can receive a bank active signal 'BA' to generate a control signal '/BLEQC'. The first BLEQ selecting unit 200(A) can generate a first bit line equalizing detection signal '/BLEQON(A)' in response to the control signal '/BLEQC' and a plurality of first mat select signals when a mat is selected from one adjacent core cell. The second BLEQ selecting unit 200(B) can generate a second bit line equalizing detection signal '/BLEQON(B)' in response to the control signal '/BLEQC' and a plurality of second mat select signals when a mat is selected from another adjacent core cell. The bit line equalizing driver 20' can receive the first bit line equalizing detection signal '/BLEQON(A)' and the second bit line equalizing detection signal '/BLEQON(B)' to generate the bit line equalizing signal 'BLEQ'. Here, the first BLEQ selecting unit 200(A) can have substantially the same structure as the second BLEQ selecting unit 200(B), wherein their exemplary structures are shown in FIG. 7.

When a mat is selected from one adjacent core cell or another adjacent core cell in the semiconductor memory apparatus employing a scheme in which core cells share the bit line sense amplifier, the control signal generating unit 100 having received the bank active signal 'BA' can generate the control signal '/BLEQC' input to the bit line equalizing selecting units 200(A) and 200(B). The bit line equalizing selecting units 200(A) and 200(B), which have received their respective mat select signals corresponding to the core cells, can generate their respective bit line equalizing detection signals '/BLEQON(A)' and '/BLEQON(B)'. In addition, the line equalizing driver 20' can receive the bit line equalizing detection signals '/BLEQON(A)' and '/BLEQON(B)'.

In FIG. 9, the bit line equalizing driver 20' can include the NAND gate 21, the first inverter 22, and the second inverter 23 to generate the bit line equalizing signal 'BLEQ' through a logic operation. The bit line equalizing signal 'BLEQ' can be input to a sense amplifier (not shown) to control an equalization operation of the bit line and the complement bit line.

The bit line equalizing signal 'BLEQ', which determines a time period to release equalization of the bit line and the complement bit line, can be delayed so that the equalizing releasing time of the bit line and the complement bit line can be delayed. Accordingly, an RAS precharge time tRP can be enhanced, and a high-speed semiconductor memory apparatus can be manufactured and implemented.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A bit line equalizing control circuit of a semiconductor memory apparatus, comprising:
    a control signal generating unit that receives a bank active signal to generate a control signal such that a bit line equalizing signal is delayed and enabled;
    a bit line equalizing selecting unit that generates a bit line equalizing detection signal in response to a plurality of mat select signals and the control signal; and
    a driver that receives the bit line equalizing detection signal to generate the bit line equalizing signal.

2. The bit line equalizing control circuit of claim 1, wherein the bit line equalizing selecting unit includes:
    a signal combining unit that combines the plurality of mat select signals with each other; and
    a detection signal generating unit that receives an output of the signal combining unit and the control signal to generate the bit line equalizing detection signal.

3. The bit line equalizing control circuit of claim 2, wherein the detection signal generating unit generates the bit line equalizing detection signal enabled if the output of the signal combining unit and the control signal are enabled.

4. The bit line equalizing control circuit of claim 1, wherein the plurality of mat select signals includes a mat select address and a redundancy fuse output that is enabled when a substitute mat is selected from a redundancy circuit.

5. The bit line equalizing control circuit of claim 1, wherein the control signal generating unit delays the bank active signal, and the control signal generating unit includes a driver that receives the bank active signal to generate the control signal.

6. The bit line equalizing control circuit of claim 2, wherein the control signal generating unit generates the control signal, which is enabled at a time period later than a time to enable the output of the signal combining unit and disabled simultaneously with or at a time period later than a time to disable the output of the signal combining unit.

7. A bit line equalizing control circuit of a semiconductor memory apparatus, comprising:
    a control signal generating unit that receives a bank active signal to generate a control signal such that a bit line equalizing signal is delayed and enabled;
    a first bit line equalizing selecting unit that generates a first bit line equalizing detection signal in response to the control signal and a plurality of first mat select signals when a mat is selected from a first core cell;
    a second bit line equalizing selecting unit that generates a second bit line equalizing detection signal in response to the control signal and a plurality of second mat select signals when a mat is selected from a second core cell different from the first core cell; and
    a bit line equalizing driver that receives the first and second bit line equalizing detection signals to generate the bit line equalizing signal.

8. The bit line equalizing control circuit of claim 7, wherein the first bit line equalizing selecting unit includes:

a first signal combining unit that combines the plurality of first mat select signals; and a first detection signal generating unit that receives an output of the first signal combining unit and the control signal to generate the first bit line equalizing detection signal.

9. The bit line equalizing control circuit of claim 8, wherein the first detection signal generating unit generates the first bit line equalizing detection signal enabled when the output of the first signal combining unit and the control signal are enabled.

10. The bit line equalizing control circuit of claim 7, wherein the second bit line equalizing selecting unit includes:

a second signal combining unit that combines the plurality of second mat select signals; and a second detection signal generating unit that receives an output of the second signal combining unit and the control signal to generate the second bit line equalizing detection signal.

11. The bit line equalizing control circuit of claim 10, wherein the second detection signal generating unit generates the second bit line equalizing detection signal enabled when the output of the second signal combining unit and the control signal are enabled.

12. The bit line equalizing control circuit of claim 7, wherein the plurality of first mat select signals include a mat select address signal generated when the mat is selected from the first core cell and a redundancy fuse output signal generated when a substitute mat is selected from a redundancy circuit.

13. The bit line equalizing control circuit of claim 7, wherein the plurality of second mat select signals include a mat select address signal generated when the mat is selected from the second core cell and a redundancy fuse output signal when a substitute mat is selected from a redundancy circuit.

14. The bit line equalizing control circuit of claim 7, wherein the control signal generating unit delays the bank active signal, and the control signal generating unit includes a driver that receives the bank active signal to generate the control signal.

15. The bit line equalizing control circuit of claim 7, wherein the control signal generating unit generates the control signal, which is enabled at a time period later than a time to enable outputs of first and second signal combining units and disabled simultaneously with or at a time later than a time to disable the outputs of the first and second signal combining units.

* * * * *